(12) United States Patent
Zhao

(10) Patent No.: US 9,742,463 B2
(45) Date of Patent: Aug. 22, 2017

(54) COPPER WIRE INTERFACE CIRCUIT

(71) Applicant: Huawei Technologies Co., Ltd., Shenzhen, Guangdong (CN)

(72) Inventor: Zhilei Zhao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/136,476

(22) Filed: Apr. 22, 2016

(65) Prior Publication Data

US 2016/0241302 A1 Aug. 18, 2016

Related U.S. Application Data

(63) Continuation of application No. PCT/CN2013/085953, filed on Oct. 25, 2013.

(51) Int. Cl.
*H04B 3/23* (2006.01)
*H03F 1/56* (2006.01)

(52) U.S. Cl.
CPC ............... *H04B 3/23* (2013.01); *H03F 1/56* (2013.01); *H03F 2200/387* (2013.01); *H03F 2200/423* (2013.01)

(58) Field of Classification Search
None
See application file for complete search history.

(56) References Cited

U.S. PATENT DOCUMENTS

| 6,804,349 B1 | 10/2004 | Prat et al. |
| 6,888,939 B1 * | 5/2005 | Zojer .................. H04L 5/1461 379/399.01 |
| 2002/0097863 A1 * | 7/2002 | Rahamim ........... H04L 27/0002 379/399.01 |

(Continued)

FOREIGN PATENT DOCUMENTS

| CN | 1434599 A | 8/2003 |
| CN | 1868009 A | 11/2006 |

(Continued)

OTHER PUBLICATIONS

Single Port, High Output Current VDSL2 Line Driver with Power Control_Texas Instruments_SBOS434_Aug. 2010_pp. 1-19.*

*Primary Examiner* — Fan Tsang
*Assistant Examiner* — Jeffrey Lytle

(57) ABSTRACT

A copper wire interface circuit is provided, where a current output amplifier is connected to a port impedance component and a transmit end, and the current output amplifier is configured to amplify a to-be-transmitted signal; the port impedance component is connected to a high-pass filter, impedance, after undergoing impedance transformation performed by the high-pass filter, of the port impedance component is used for performing impedance matching with equivalent impedance of a cable and a load; the high-pass filter is connected to the port impedance component and the cable, the high-pass filter is configured to filter the to-be-transmitted signal or a received signal and perform impedance transformation on the port impedance component; and an echo cancellation module is connected to the port impedance component and a receive end.

11 Claims, 6 Drawing Sheets

(56) References Cited

U.S. PATENT DOCUMENTS

2006/0062378 A1* 3/2006 Choksi .................. H04B 3/03
  379/399.01
2007/0001794 A1 1/2007 Alford et al.

FOREIGN PATENT DOCUMENTS

| | | | |
|---|---|---|---|
| CN | 101359932 A | 2/2009 | |
| CN | 101505174 A | 8/2009 | |
| CN | 102082886 A | 6/2011 | |
| CN | EP 2479972 A1 * | 7/2012 | ............ H04B 1/581 |
| EP | 2 479 972 A1 | 7/2012 | |
| JP | H07303020 A | 11/1995 | |
| JP | 20017739 A | 1/2001 | |
| JP | 2009147512 A | 7/2009 | |
| WO | WO 99/50970 A1 | 10/1999 | |
| WO | WO 02/065662 A2 | 8/2002 | |

* cited by examiner

COPPER WIRE INTERFACE CIRCUIT

CROSS-REFERENCE TO RELATED APPLICATIONS

This application is a continuation of International Application No. PCT/CN2013/085953, filed on Oct. 25, 2013, which is hereby incorporated by reference in its entirety.

TECHNICAL FIELD

The present invention relates to communications technologies, and in particular, to a copper wire interface circuit.

BACKGROUND

With the development of communications technologies, the gigabit copper wire (G.fast) leads a rate of copper wire access into a gigabit era. The G.fast is an access technology for ultra-high-rate bandwidth transmission over short-distance twisted pairs. An initial stage of a high frequency band of the G.fast uses 106 MHz and may be expanded to 212 MHz, and the G.fast with a higher frequency can obtain broader bandwidth. However, a higher signal frequency indicates a shorter transmission distance and higher costs and power consumption. In terms of uplink and downlink rate division, an FDD frequency division manner similar to that of the VDSL2 is not used in the G.fast; instead, a TDD time division multiplexing manner is used, and different time windows are used and assigned to uplink and downlink traffic.

A signal frequency used in the G.fast technology, compared with as existing DSL technology, is greatly expanded to a high frequency, but, at the same time, crosstalk between different ports of a bundle of cables is much severer than that of the existing DSL technology. Whether terminating impedance of a user port connected to a cable is matched not only affects mutual crosstalk between another wire pair, but also affects a transmission characteristic of two ends of the another wire pair in the cable. It can be known from the definition of impedance matching that impedance matching indicates specific cooperation relationships among load impedance, cable characteristic impedance, and impedance inside a signal source in a signal transmission process. Therefore, it is necessary to keep port impedance basically unchanged regardless of whether the port is in a transmitting, receiving, active, or inactive state.

In the prior art, a user port is connected through an interface circuit to a cable using the G.fast technology. In order to reduce power consumption for the interface circuit, when a signal transmitted by using the cable is received or the port is in an inactive state, a transmission-related device of the interface circuit stops working according to a characteristic that the TDD time division multiplexing is used in the G.fast technology. Similarly, when a signal is sent to the cable by using the cable, a reception-related device of the interface circuit stops working. However, because of a defect in design of a G.fast interface circuit in the prior art, when a device in the interface circuit in the technology is in a different state such as a working state or a working stopped state, an impedance characteristic of the device changes, resulting in that terminating impedance of the user port cannot be matched, thereby causing a change in mutual crosstalk between a wire pair and a change in a transmission characteristic of two ends of the wire pair. As a result, transmission stability of the cable decreases.

SUMMARY

Embodiments of the present invention provide a copper wire interface circuit, which can prevent a transmission characteristic of two ends of a wire pair from changing and improve transmission stability of a cable.

A first aspect of the present invention provides a copper wire interface circuit, including a current output amplifier, a port impedance component, a high-pass filter, and an echo cancellation module, where:

one end of the current output amplifier is connected to the port impedance component, another end of the current output amplifier is connected to a transmit end, the current output amplifier is configured to amplify a to-be-transmitted signal, and output of the current output amplifier has a high impedance characteristic;

the port impedance component is further connected to the high-pass filter, and impedance, after undergoing impedance transformation performed by the high-pass filter, of the port impedance component is used for performing impedance matching with equivalent impedance of a cable and a load;

one end of the high-pass filter is connected to the port impedance component, another end of the high-pass filter is connected to the cable, and the high-pass filter is configured to filter the to-be-transmitted signal or a received signal and perform impedance transformation on the port impedance component; and one end of the echo cancellation module is connected to the port impedance component, another end of the echo cancellation module is connected to a receive end, and the echo cancellation module is configured to perform sampling processing on the received signal and is further configured to perform cancellation processing on the to-be-transmitted signal.

With reference to the first aspect, in a first possible implementation manner, the port impedance component includes a first impedance, a second impedance, and a third impedance, where:

one end of the first impedance is connected to one end of the second impedance, and another end of the first impedance is connected to one end of the third impedance;

the one end of the second impedance is further connected to the current output amplifier, and another end of the second impedance is connected to one input pin of the high-pass filter; and the one end of the third impedance is further connected to the current output amplifier, and another end of the third impedance is further connected to another input pin of the high-pass filter, where:

a value of the first impedance is far greater than a value of the second impedance, the value of the first impedance is far greater than a value of the third impedance, and the value of the second impedance is equal to the value of the third impedance; and the echo cancellation module includes a fourth impedance, a fifth impedance, a sixth impedance, and a seventh impedance, where:

one end of the fourth impedance is connected to one end of the fifth impedance, another end of the fourth impedance is connected to the one end of the second impedance, and the one end of the fourth impedance is further connected to a receive end;

the one end of the fifth impedance is further connected to the receive end, and another end of the fifth impedance is connected to the another end of the third impedance;

one end of the sixth impedance is connected to one end of the seventh impedance, another end of the sixth impedance is connected to the one end of the third impedance, and the one end of the sixth impedance is further connected to a receive end; and the one end of the seventh impedance is further connected to the receive end, and another end of the seventh impedance is connected to the another end of the second impedance, where:

a value of the fourth impedance is the same as a value of the sixth impedance, a value of the fifth impedance is the same as a value of the seventh impedance, the value of the fourth impedance is far greater than the value of the first impedance, the value of the fourth impedance is far greater than the value of the second impedance, the value of the fourth impedance is far greater than the value of the third impedance, a value of the fifth impedance is far greater than the value of the first impedance, the value of the fifth impedance is far greater than the value of the second impedance, and the value of the fifth impedance is far greater than the value of the third impedance.

With reference to the first possible implementation manner of the first aspect, in a second possible implementation manner, the first impedance includes a first sub-impedance and a second sub-impedance, where:

the first sub-impedance is connected in series to the second sub-impedance, and a reference power supply is connected between the first sub-impedance and the second sub-impedance, where:

a value of the first sub-impedance is the same as a value of the second sub-impedance.

With reference to the first aspect, in a third possible implementation manner, the port impedance component includes an eighth impedance and a ninth impedance; where one end of the eighth impedance is connected to the current output amplifier, the one end of the eighth impedance is further connected to one input pin of the high-pass filter, another end of the eighth impedance is connected to the current output amplifier, and the one end of the eighth impedance is further connected to another input pin of the high-pass filter; and the ninth impedance is connected between two central taps of a secondary side of a transformer in the high-pass filter, where:

a value of the eighth impedance is far greater than a value of the ninth impedance; and the echo cancellation module includes a tenth impedance, an eleventh impedance, a twelfth impedance, and a thirteenth impedance, where:

one end of the tenth impedance is connected to one end of the eleventh impedance, another end of the tenth impedance is connected to the one input pin of the high-pass filter, and the one end of the tenth impedance is further connected to a receive end;

the one end of the eleventh impedance is further connected to the receive end, and another end of the eleventh impedance is connected to one end of the ninth impedance;

one end of the twelfth impedance is connected to one end of the thirteenth impedance, another end of the twelfth impedance is connected to the another input pin of the high-pass filter, and the one end of the twelfth impedance is further connected to a receive end; and the one end of the thirteenth impedance is further connected to the receive end, and another end of the thirteen impedance is connected to another end of the ninth impedance; where a value of the tenth impedance is the same as a value of the twelfth impedance, a value of the eleventh impedance is the same as a value of the thirteenth impedance, the value of the tenth impedance is far greater than the value of the eighth impedance, the value of the tenth impedance is far greater than the value of the ninth impedance, a value of the eleventh impedance is far greater than the value of the eighth impedance, and the value of the eleventh impedance is far greater than the value of the ninth impedance.

With reference to the third possible implementation manner of the first aspect, in a fourth possible implementation manner, the eighth impedance includes a third sub-impedance and a fourth sub-impedance, where:

the third sub-impedance is connected in series to the fourth sub-impedance, and a reference power supply is connected between the third sub-impedance and the fourth sub-impedance, where:

a value of the third sub-impedance is the same as a value of the fourth sub-impedance.

With reference to the third possible implementation manner or fourth possible implementation manner of the first aspect, in a fifth possible implementation manner, the ninth impedance includes a fifth sub-impedance and a sixth sub-impedance, where:

the fifth sub-impedance is connected in series to the sixth sub-impedance, and a reference power supply is connected between the fifth sub-impedance and the sixth sub-impedance, where:

a value of the fifth sub-impedance is the same as a value of the sixth sub-impedance.

With reference to the first aspect, in a sixth possible implementation manner, the port impedance component includes a fourteenth impedance, a fifteenth impedance, and a sixteenth impedance, where:

one end of the fourteenth impedance is connected to one input pin of the high-pass filter, the one end of the fourteenth impedance is further connected to one end of the fifteenth impedance, another end of the fourteenth impedance is connected to another input pin of the high-pass filter, and the another end of the fourteenth impedance is further connected to one end of the sixteenth impedance;

another end of the fifteenth impedance is connected to the current output amplifier; and another end of the sixteenth impedance is connected to the current output amplifier, where:

a value of the fourteenth impedance is far greater than a value of the fifteenth impedance, the value of the fourteenth impedance is far greater than a value of the sixteenth impedance, and the value of the fifteenth impedance is equal to the value of the sixteenth impedance; and the echo cancellation module includes a seventeenth impedance, an eighteenth impedance, a nineteenth impedance, and a twentieth impedance, where:

one end of the seventeenth impedance is connected to one end of the eighteenth impedance, another end of the seventeenth impedance is connected to the another end of the fifteenth impedance, and the one end of the seventeenth impedance is further connected to a receive end;

another end of the eighteenth impedance is connected to the one end of the sixteenth impedance, and the one end of the eighteenth impedance is further connected to the receive end;

one end of the nineteenth impedance is connected to one end of the twentieth impedance, another end of the nineteenth impedance is connected to the another end of the sixteenth impedance, and the one end of the nineteenth impedance is further connected to the receive end; and another end of the twentieth impedance is connected to the one end of the fifteenth impedance, and the one end of the twentieth impedance is further connected to the receive end, where:

a value of the seventeenth impedance is the same as a value of the nineteenth impedance, a value of the eighteenth impedance is the same as a value of the twentieth impedance, the value of the seventeenth impedance is far greater than the value of the fourteenth impedance, the value of the seventeenth impedance is far greater than the value of the fifteenth impedance, the value of the seventeenth impedance is far greater than the value of the sixteenth impedance, a value of the eighteenth impedance is far greater than the value of the fourteenth impedance, the value of the eighteenth impedance is far greater than the value of the fifteenth impedance, and the value of the eighteenth impedance is far greater than the value of the sixteenth impedance.

With reference to the sixth possible implementation manner of the first aspect, in a seventh possible implementation manner, the fourteenth impedance includes a seventh sub-impedance and an eighth sub-impedance, where:

the seventh sub-impedance is connected in series to the eighth sub-impedance, and a reference power supply is connected between the seventh sub-impedance and the eighth sub-impedance, where:

a value of the seventh sub-impedance is the same as a value of the eighth sub-impedance.

With reference to the first aspect or the foregoing possible implementation manners of the first in an eighth possible implementation manner, the high-pass filter includes the transformer and a DC blocking capacitor, where:

the transformer includes two input pins and two output pins, where one output pin is connected to one end of the equivalent impedance of the cable and load, and the other output pin is connected to another end of the equivalent impedance of the cable and load; and the DC blocking capacitor is connected between two taps on a primary side of the transformer; or one end of the DC blocking capacitor is connected to one output pin of the transformer, and another end of the DC blocking capacitor is connected to the one end of the equivalent impedance of the cable and load; or the DC blocking capacitor includes a first DC blocking sub-capacitor and a second DC blocking sub-capacitor, where one end of the first DC blocking sub-capacitor is connected to the one output pin of the transformer, and another end of the first DC blocking sub-capacitor is connected to the one end of the equivalent impedance of the cable and load; and one end of the second DC blocking sub-capacitor is connected to the other output pin of the transformer, and another end of the second DC blocking sub-capacitor is connected to the another end of the equivalent impedance of the cable and load.

With reference to the eighth possible implementation manner of the first aspect, in a ninth possible implementation manner, two taps on a secondary side of the transformer are connected to each other; or two taps on a secondary side of the transformer are connected to each other and are connected to a reference power supply; or the high-pass filter further includes a capacitor, where:

the capacitor is connected between two taps on a secondary side of the transformer.

With reference to the third possible implementation manner or eighth possible implementation manner of the first aspect, in a tenth possible implementation manner, the ninth impedance is connected between the two central taps on the secondary side of the transformer.

In the copper wire interface circuit provided in the embodiments, one end of a current output amplifier is connected to a port impedance component, another end of the current output amplifier is connected to a transmit end; the current output amplifier is configured to amplify a to-be-transmitted signal, and output of the current output amplifier has a high impedance characteristic; the port impedance component is further connected to a high-pass filter, and impedance, after undergoing impedance transformation performed by the high-pass filter, of the port impedance component is used for performing impedance matching with equivalent impedance of a cable and a load. One end of the high-pass filter is connected to the port impedance component, another end of the high-pass filter is connected to the cable, and the high-pass filter is configured to filter the to-be-transmitted signal or a received signal and perform impedance transformation on the port impedance component. One end of an echo cancellation module is connected to the port impedance component, another end of the echo cancellation module is connected to a receive end, and the echo cancellation module is configured to perform sampling processing on the received signal and perform cancellation processing on the to-be-transmitted signal. Therefore, when a reception-related component is switched off during transmission or a transmission-related component is switched off during reception to reduce power consumption, because output impedance of the current output amplifier is high impedance, port impedance is mainly determined by the port impedance component and the high-pass filter. Because the output impedance when the current output amplifier is enabled end after the current output amplifier is switched off is greatly higher than impedance of the port impedance component, a state change of the current output amplifier basically does not affect the port impedance, thereby ensuring that a specific matching relationship between terminating impedance of a user port, and cable characteristic impedance and impedance inside a signal source is unchanged. Further, a change in mutual crosstalk between a wire pair is avoided, and a change in a transmission characteristic of two ends of the wire pair is avoided, thereby improving transmission stability of the cable.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description show some embodiments of the present invention, and a person of ordinary skill in the art may still derive other drawings from these accompanying drawings without creative efforts.

DETAILED DESCRIPTION

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some rather than all of the embodiments of the present invention. All other embodiments obtained by a person of ordinary skill in the art based on the embodiments of the present invention without creative efforts should fall within the protection scope of the present invention.

Embodiment 1

Figure 1:
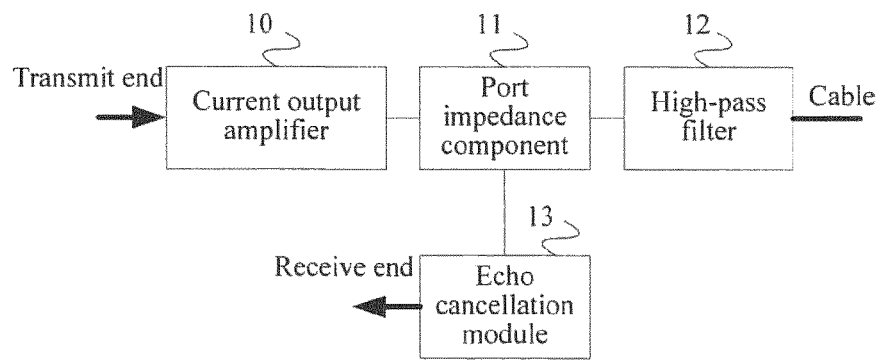
FIG. 1 is a schematic structural diagram of a copper wire interface circuit of Embodiment 1 according to the present invention.

FIG. 1 is a schematic structural diagram of a copper wire interface circuit of Embodiment 1 according to the present invention. As shown in FIG. 1, the copper wire interface circuit includes a current output amplifier 10, a port impedance component 11, a high-pass filter 12, and an echo cancellation module 13.

One end of the current output amplifier 10 is connected to the port impedance component, another end of the current output amplifier 10 is connected to a transmit end, the current output amplifier 10 is configured to amplify a to-be-transmitted signal, and output of the current output amplifier 10 has a high impedance characteristic.

The port impedance component 11 is further connected to the high-pass filter 12, and impedance, after undergoing impedance transformation performed by the high-pass filter 12, of the port impedance component is used for performing impedance matching with equivalent impedance of a cable and a load.

It should be noted that because the high-pass filter 12 includes a transformer, and a ratio of a quantity of primary turns to a quantity of secondary turns of the transformer is changeable, it is necessary to set a value of the pert impedance component according to the ratio. In processes of receiving and transmitting a signal by the copper wire interface circuit, an impedance value obtained after the value of the port impedance component undergoes impedance transformation performed by the high-pass filter 12 can be used for performing impedance matching with the equivalent impedance of the cable and load. For example, if characteristic impedance of a twisted-pair cable is Z0, load impedance is also designed according to Z0. If a ratio of a quantity of secondary turns to a quantity of primary turns in the transformer of the high-pass filter 12 is 1:n, the port impedance component 11 should be designed according to Z0/(n*n). Impedance obtained after impedance, Z0/(n*n), of the port impedance component 11 is transformed by the transformer is Z0.

Equivalent impedance of the cable and load is comprehensive equivalent impedance of both a cable of a length and a load. The foregoing example is still used; if the characteristic impedance of the cable is Z0 and the load impedance is Z0, the equivalent impedance of the cable and load is also Z0.

One end of the high-pass filter 12 is connected to the port impedance component 11, another end of the high-pass filter 12 is connected to the cable, and the high-pass filter 12 is configured to filter the to-be-transmitted signal or a received signal and perform impedance transformation on the port impedance component 11.

One end of the echo cancellation module 13 is connected to the port impedance component, another end of the echo cancellation module 13 is connected to a receive end, and the echo cancellation module 13 is configured to perform sampling processing on the received signal and is further configured to perform cancellation processing on the to-be-transmitted signal.

In the copper wire interface circuit provided in this embodiment, one end of a current output amplifier is connected to a port impedance component, another end of the current output amplifier is connected to a transmit end the current output amplifier is configured to amplify a to-be-transmitted signal, and output of the current output amplifier has a high impedance characteristic; the port impedance component is further connected to a high-pass filter, and impedance, after undergoing impedance transformation performed by the high-pass filter, of the port impedance component is used for performing impedance matching with equivalent impedance of a cable and a load. One end of the high-pass filter is connected to the port impedance component, another end of the high-pass filter is connected to the cable, and the high-pass filter is configured to filter the to-be-transmitted signal or a received signal and perform impedance transformation on the port impedance component. One end of an echo cancellation module is connected to the port impedance component, another end of the echo cancellation module is connected to a receive end, and the echo cancellation module is configured to perform sampling processing on the received signal and perform cancellation processing on the to-be-transmitted signal. Therefore, when a reception-related component is switched off during transmission or a transmission-related component is switched off during reception to reduce power consumption, because output impedance of the current output amplifier is high impedance, port impedance is mainly determined by the port impedance component and the high-pass filter. Because the output impedance when the current output amplifier is enabled and after the current output amplifier is switched off is greatly higher than impedance of the pert impedance component, a state change of the current output amplifier basically does not affect the port impedance, thereby ensuring that a specific matching relationship between terminating impedance of a user port, and cable characteristic impedance and impedance inside a signal source is unchanged. Further, a change in mutual crosstalk between a wire pair is avoided, and a change in a transmission characteristic of two ends of the wire pair is avoided, thereby improving transmission stability of the cable.

The copper wire interface circuit provided in the present invention may be implemented in multiple possible implementation manners, and the possible implementation manners are described below by using specific embodiments.

Embodiment 2

Figure 2:
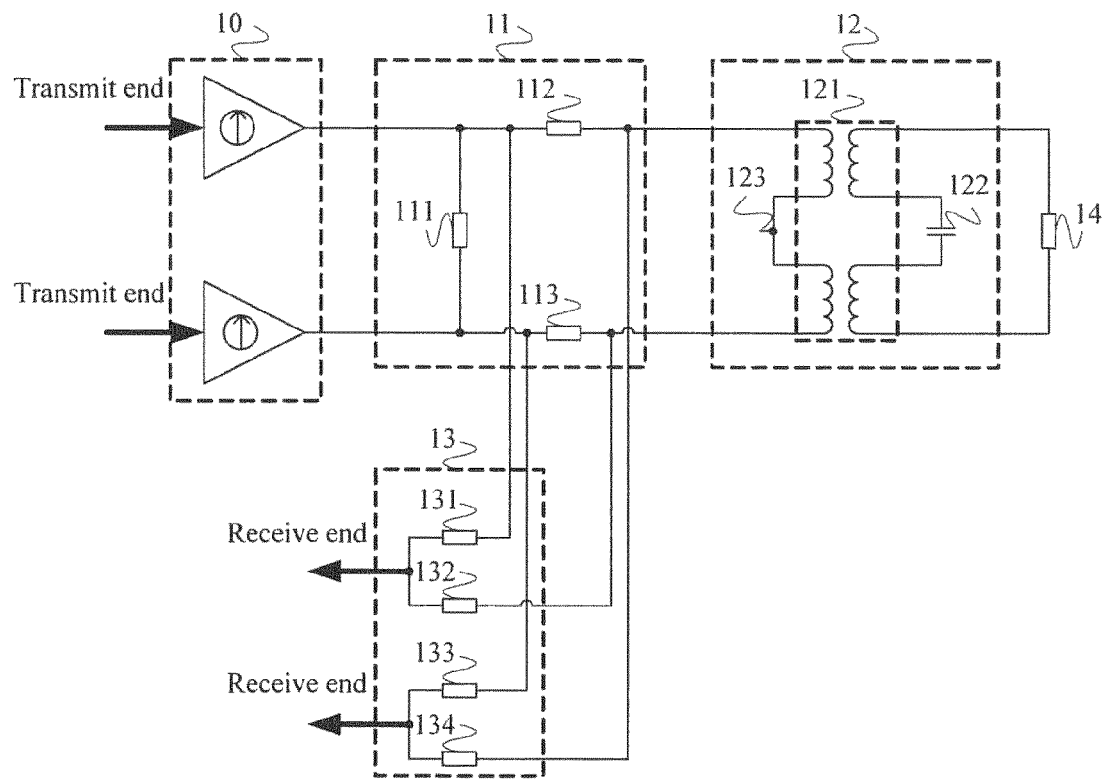
FIG. 2 is a schematic structural diagram of a copper wire interface circuit of Embodiment 2 according to the present invention.

FIG. 2 is a schematic structural diagram of a copper wire interface circuit of Embodiment 2 according to the present invention. As shown in FIG. 2, a port impedance component 11 includes a first impedance 111, a second impedance 112, and a third impedance 113.

One end of the first impedance 111 is connected to one end of the second impedance 112, and another end of the first impedance 111 is connected to one end of the third impedance 113.

The one end of the second impedance 112 is further connected to a current output amplifier 10, and another end of the second impedance 112 is connected to one input pin of a high-pass filter 12.

One end of the third impedance 113 is further connected to the current output amplifier 10, and another end of the third impedance 113 is further connected to another input pin of the high-pass filter 12.

A value of the first impedance 111 is far greater than a value of the second impedance 112, the value of the first impedance 111 is far greater than a value of the third impedance 113, and the value of the second impedance 112 is equal to the value of the third impedance 113.

It should be noted that the concept of "far greater than" in this embodiment and the following embodiments indicates: a value is at least three times another value, for example, in the foregoing text, the value of the first impedance 111 is at least three times greater than the value of the second impedance 112. Therefore, as long as it is ensured, that a value is at least three times great than another value, the requirement of "far greater than" in the embodiments of the present invention can be satisfied, and a specific multiple thereof can be set by a circuit designer according to an experience, and is not limited herein.

An echo cancellation module 13 includes a fourth impedance 131, a fifth impedance 132, a sixth impedance 133, and a seventh impedance 134.

One end of the fourth impedance 131 is connected to one end of the fifth impedance 132, another end of the fourth impedance 131 is connected to the one end of the second impedance 112, and the one end of the fourth impedance 131 is further connected to a receive end.

The one end of the fifth impedance 132 is further connected to the receive end, and another end of the fifth impedance 132 is connected to the another end of the third impedance 113.

One end of the sixth impedance 133 is connected to one end of the seventh impedance 134, another end of the sixth impedance 133 is connected to the one end of the third impedance 113, and the one end of the sixth impedance 133 is further connected to a receive end.

The one end of the seventh impedance 134 is further connected to the receive end, and another end of the seventh impedance 134 is connected to the another end of the second impedance 112.

A value of the fourth impedance 131 is the same as a value of the sixth impedance 133, a value of the fifth impedance 132 is the same as a value of the seventh impedance 134, the value of the fourth impedance 131 is far greater than the value of the first impedance 111, the value of the fourth impedance 131 is far greater than the value of the second impedance 112, the value of the fourth impedance 131 is far greater than the value of the third impedance 113, a value of the fifth impedance 132 is far greater than the value of the first impedance 111, the value of the fifth impedance 132 is far greater than the value of the second impedance 112, and the value of the fifth impedance 132 is far greater than the value of the third impedance 113.

The high-pass filter 12 includes a transformer 121 and a DC blocking capacitor 122.

The transformer 121 includes two input pins and two output pins, where one output pin is connected to one end of equivalent impedance of a cable and a load, and the other output pin is connected to another end of the equivalent impedance of the cable and load.

The DC blocking capacitor 122 is connected between two taps on a primary side of the trans former 121; or
  one end of the DC blocking capacitor 122 is connected to the one output pin of the transformer 121, and another end of the DC blocking capacitor 122 is connected to the one end of the equivalent impedance of the cable and load; or
  further, optionally, the DC blocking capacitor 122 includes a first DC blocking sub-capacitor and a second DC blocking sub-capacitor.

One end of the first DC blocking sub-capacitor is connected to the one output pin of the transformer 121, and another end of the first DC blocking sub-capacitor is connected to the one end of the equivalent impedance 14 of the cable and load.

One end of the second DC blocking sub-capacitor is connected to the other output pin of the transformer 121, and another end of the second DC blocking sub-capacitor is connected to the another end of the equivalent impedance 14 of the cable and load.

Further, a possible implementation manner is that two taps on a secondary side of the transformer 121 are connected to each other; or
  another possible implementation manner is that two taps on a secondary side of the transformer 121 are connected to each other and are connected to a reference power supply 123; or
  a possible implementation manner is that the high-pass filter 12 further includes a capacitor.

The capacitor is connected between two taps on a secondary side of the transformer 121.

The current output amplifier 10 is used, and output of the current output amplifier 10 has a high impedance characteristic when the current output amplifier 10 works normally, the output impedance of the current output amplifier 10 is high impedance when compared with that of the port impedance component, and when the current output amplifier 10 is switched off, the output of the current output amplifier 10 is also high impedance. Port impedance is mainly determined by the port impedance component and the high-pass filter that includes the transformer, and switch-on and switch-off of the current output amplifier 10 do not affect the port impedance; the port impedance component 11 that mainly includes the first impedance 111, the second impedance 112, and the third impedance 113 as a resistor network is transformed by the high-pass filter including the transformer and then matches the equivalent impedance 14 of the cable and load; the second impedance 112 and the third impedance 113 are sampling resistors in a receiving direction; generally, to reduce power consumption, the value of the first impedance 111 is far greater than those of the second impedance 112 and the third impedance 113.

Figure 3:
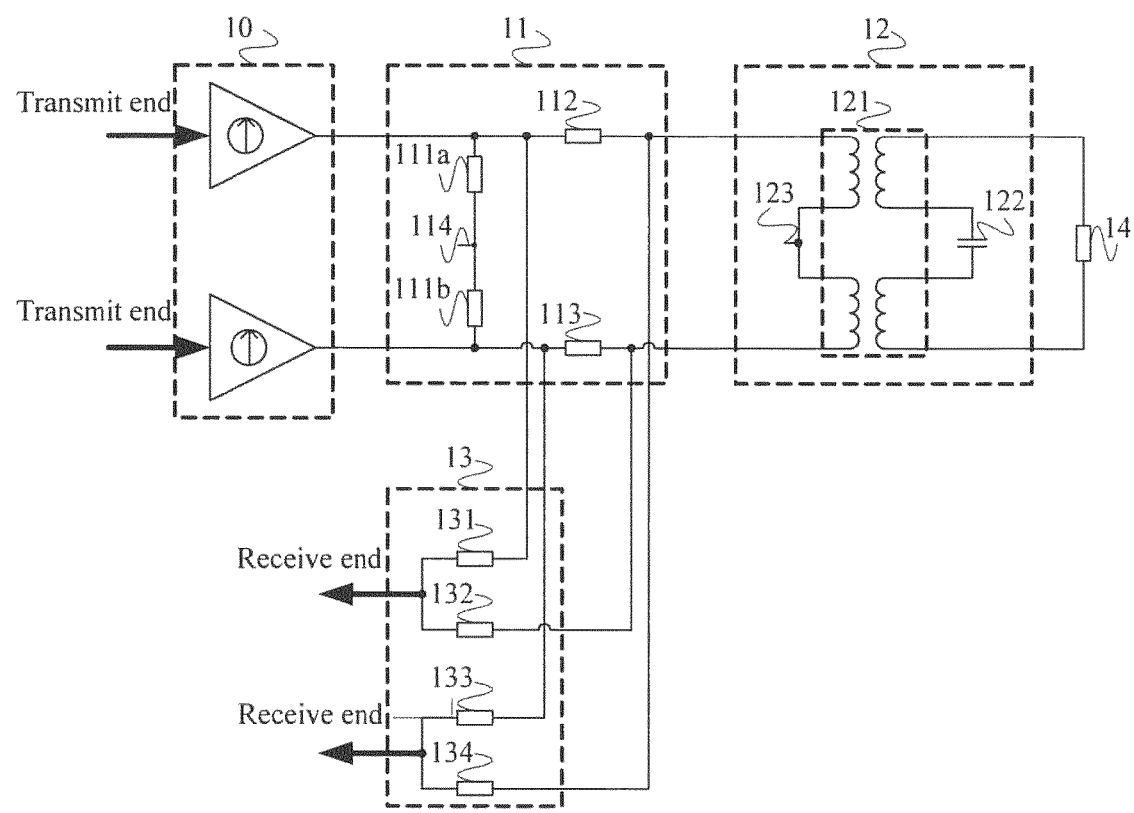
FIG. 3 is a schematic structural diagram of another copper wire interface circuit of Embodiment 2 according to the present invention.

Further, based on FIG. 2, FIG. 3 is a schematic structural diagram of another copper wire interface circuit of Embodiment 2 according to the present invention. It should be noted that except that the first impedance 111 is improved in the copper wire interface circuit shown in FIG. 3, other components are completely consistent with the components shown in FIG. 2 and details are not described again herein. As shown in FIG. 3, the first impedance 111 includes a first sub-impedance 111a and a second sub-impedance 111b.

The first sub-impedance 111a is connected in series to the second sub-impedance 111b, and a reference power supply 114 is connected between the first sub-impedance 111a and the second sub-impedance 111b.

A value of the first sub-impedance 111a is the same as a value of the second sub-impedance 111b.

Embodiment 3

Figure 4:
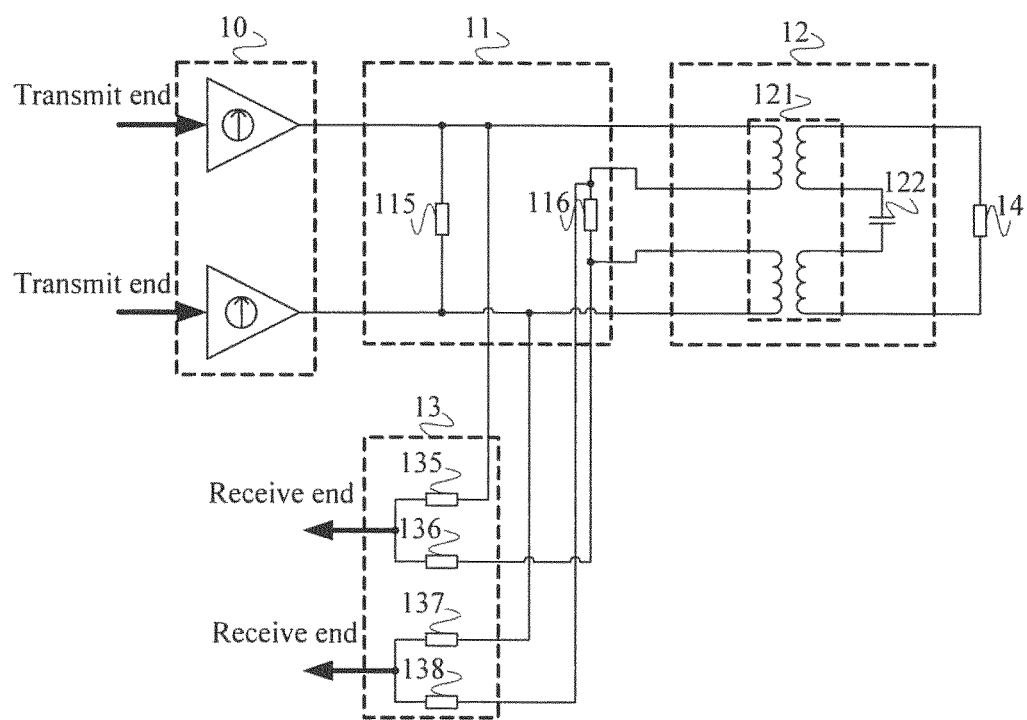
FIG. 4 is a schematic structural diagram of a copper wire interface circuit of Embodiment 3 according to the present invention.

FIG. 4 is a schematic structural diagram of a copper wire interface circuit of Embodiment 3 according to the present invention. As shown in FIG. 4, a port impedance component 11 includes an eighth impedance 115 and a ninth impedance 116.

One end of the eighth impedance 115 is connected to a current output amplifier 10, the one end of the eighth impedance 115 is further connected to one input pin of a high-pass filter 12, another end of the eighth impedance 115 is connected to the current output amplifier 10, and the one end of the eighth impedance 115 is further connected to another input pin of the high-pass filter 12.

The ninth impedance 116 is connected between two central taps on a secondary side of a transformer 121 in the high-pass filter 12.

Specifically, the ninth impedance 116 is connected between two taps on the secondary side of the transformer 121.

A value of the eighth impedance 115 is far greater than a value of the ninth impedance 116.

An echo cancellation module 13 includes a tenth impedance 135, an eleventh impedance 136, a twelfth impedance 137, and a thirteenth impedance 138.

One end of the tenth impedance 135 is connected to one end of the eleventh impedance 136, another end of the tenth impedance 135 is connected to the one input pin of the high-pass filter 12, and the one end of the tenth impedance 135 is further connected to a receive end.

The one end of the eleventh impedance 136 is further connected to the receive end, and another end of the eleventh impedance 136 is connected to one end of the ninth impedance 116.

One end of the twelfth impedance 137 is connected to one end of the thirteenth impedance 138, another end of the twelfth impedance 137 is connected to the another input pin of the high-pass filter 12, and the one end of the twelfth impedance 137 is further connected to a receive end.

The one end of the thirteenth impedance 138 is further connected to the receive end, and another end of the thirteenth impedance 138 is connected to another end of the ninth impedance 116.

A value of the tenth impedance 135 is the same as a value of the twelfth impedance 137, a value of the eleventh impedance 136 is the same as a value of the thirteenth impedance 138, the value of the tenth impedance 135 is far greater than the value of the eighth impedance 115, the value of the tenth impedance 135 is far greater than the value of the ninth impedance 116, a value of the eleventh impedance 136 is far greater than the value of the eighth impedance 115, and the value of the eleventh impedance 136 is far greater than the value of the ninth impedance 116.

The high-pass filter 12 includes the transformer 121 and a DC blocking capacitor 122.

The transformer 121 includes two input pins and two output pins, where one output pin is connected to one end of the equivalent impedance of a cable and a load, and the other output pin is connected to another end of the equivalent impedance of the cable and load.

The DC blocking capacitor 122 is connected between two taps on a primary side of the transformer 121; or
  one end of the DC blocking capacitor 122 is connected to the one output pin of the transformer 121, and another end of the DC blocking capacitor 122 is connected to the one end of the equivalent impedance 14 of the cable and load; or
  further, optionally, the DC blocking capacitor 122 includes a first DC blocking sub-capacitor and a second DC blocking sub-capacitor.

One end of the first DC blocking sub-capacitor is connected to the one output pin of the transformer 121, and another end of the first DC blocking sub-capacitor is connected to the one end of the equivalent impedance of the cable and load.

One end of the second DC blocking sub-capacitor is connected to the other output pin of the transformer 121, and another end of the second DC blocking sub-capacitor is connected to the another end of the equivalent impedance of the cable and load.

Further, a possible implementation manner is that two taps on a secondary side of the transformer 121 are connected to each other; or
  another possible implementation manner is that two taps on a secondary side of the transformer 121 are connected to each other and are connected to a reference power supply; or
  a possible implementation manner is that the high-pass filter 12 further includes a capacitor.

The capacitor is connected between two taps on a secondary side of the transformer 121.

The current output amplifier 10 is used, and output of the current output amplifier 10 has a high impedance characteristic; the port impedance component 11 that mainly includes the first impedance 111, second impedance 112, and third impedance 113 as a resistor network undergoes impedance transformation performed by the transformer 121 and then matches the equivalent impedance 14 of the cable and load; the ninth impedance 116 is a sampling resistor in a receiving direction; generally, to reduce power consumption, the value of the eighth impedance 115 is far greater than that of the ninth impedance 116.

The echo cancellation module 13 includes the tenth impedance 135, the eleventh impedance 136, the twelfth impedance 137, and the thirteenth impedance 138 as an impedance network, where the tenth impedance 135, the eleventh impedance 136, the twelfth impedance 137, and the thirteenth impedance 138 separately sample voltages on two sides of the ninth impedance 116 and a secondary voltage of the transformer 121 to complete sampling for a received signal and cancellation for a signal in a transmitting direction. Generally, impedance values of the tenth impedance 135 and the eleventh impedance 136 are far greater than those of the eighth impedance 115 and the ninth impedance 116.

Figure 5:
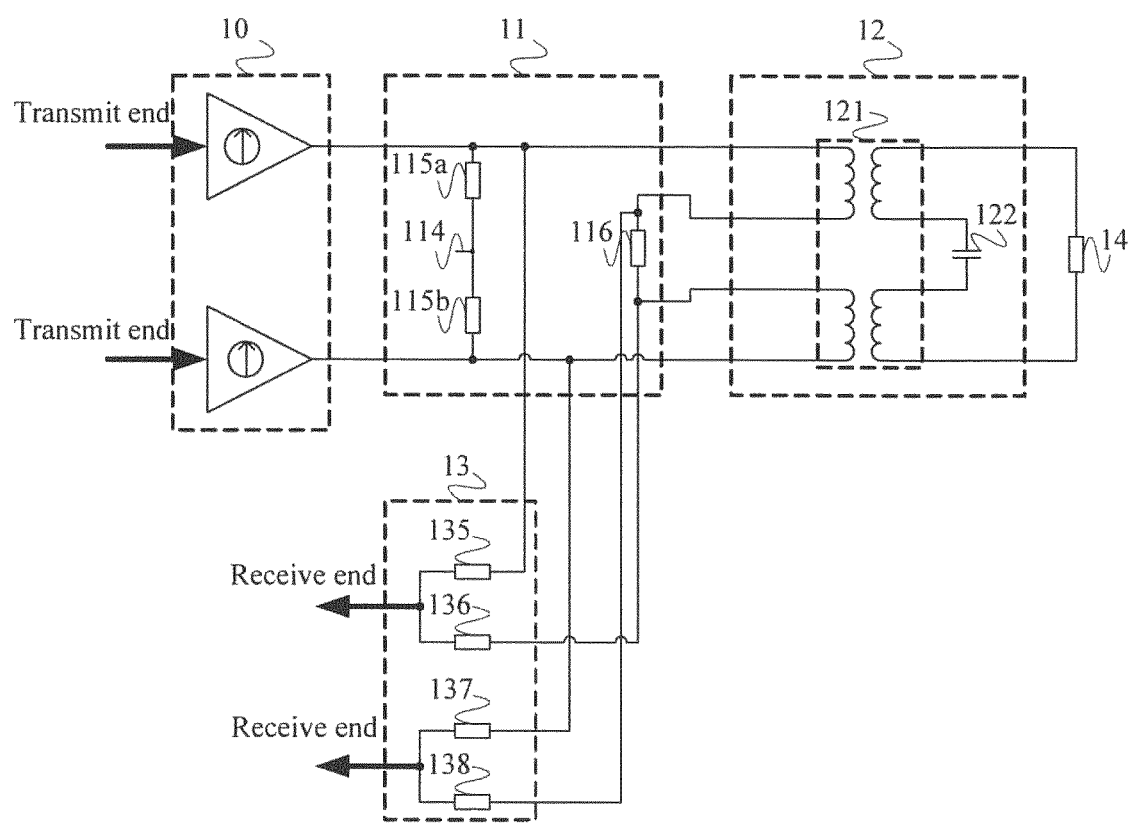
FIG. 5 is a schematic structural diagram of another copper wire interface circuit of Embodiment 3 according to the present invention.

Further, based on FIG. 4, FIG. 5 is a schematic structural diagram of another copper wire interface circuit of Embodiment 3 according to the present invention. It should be noted that except that the eighth impedance 115 and the ninth impedance 116 are improved in the copper wire interface circuit shown in FIG. 5, other components are completely consistent with the components shown in FIG. 4 and details are not described again herein. As shown in FIG. 5, the eighth impedance 115 includes a third sub-impedance 115a and a fourth sub-impedance 115b.

The third sub-impedance 115a is connected in series to the fourth sub-impedance 115b, and a reference power supply 114 is connected between the third sub-impedance 115a and the fourth sub-impedance 115b.

A value of the third sub-impedance 115a is the same as a value of the fourth sub-impedance 115b.

Alternatively, another feasible implementation manner is that the eighth impedance 115 is one impedance, and the ninth impedance 116 includes a fifth sub-impedance and a sixth sub-impedance.

The fifth sub-impedance is connected in series to the sixth sub-impedance, and a reference power supply is connected between the fifth sub-impedance and the sixth sub-impedance.

A value of the fifth sub-impedance is the same as a value of the sixth sub-impedance.

Because a form of dividing the ninth impedance 116 into the fifth sub-impedance and the sixth sub-impedance is similar to that of dividing the eighth impedance 115, the fifth sub-impedance and the sixth sub-impedance are not shown in the figure herein.

Embodiment 4

Figure 6:
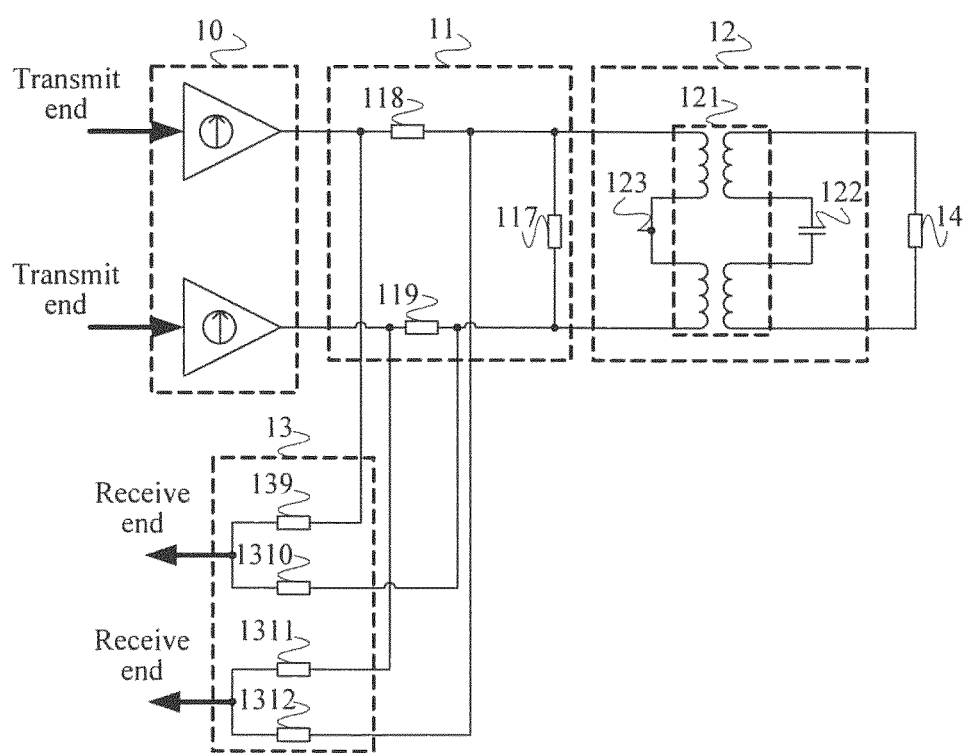
FIG. 6 is a schematic structural diagram of a copper wire interface circuit of Embodiment 4 according to the present invention.

FIG. 6 is a schematic structural diagram of a copper wire interface circuit of Embodiment 4 according to the present invention. As shown in FIG. 6, a port impedance component 11 includes a fourteenth impedance 117, a fifteenth impedance 118, and a sixteenth impedance 119.

One end of the fourteenth impedance 117 is connected to one input pin of a high-pass filter 12, the one end of the fourteenth impedance 117 is further connected to one end of the fifteenth impedance 118, another end of the fourteenth impedance 117 is connected to another input pin of the high-pass filter 12, and the another end of the fourteenth impedance 117 is further connected to one end of the sixteenth impedance 119.

Another end of the fifteenth impedance 118 is connected to a current output amplifier 10.

Another end of the sixteenth impedance 119 is connected to the current output amplifier 10.

A value of the fourteenth impedance 11 is far greater than a value of the fifteenth impedance 118, the value of the fourteenth impedance 117 is far greater than a value of the sixteenth impedance 119, and the value of the fifteenth impedance 118 is equal to the value of the sixteenth impedance 119.

An echo cancellation module 13 includes a seventeenth impedance 139, an eighteenth impedance 1310, a nineteenth impedance 1311, and a twentieth impedance 1312.

One end of the seventeenth impedance 139 is connected to one end of the eighteenth impedance 1310, another end of the seventeenth impedance 139 is connected to the another end of the fifteenth impedance 118, and the one end of the seventeenth impedance 139 is further connected to a receive end.

Another end of the eighteenth impedance 1310 is connected to the one end of the sixteenth impedance 119, and the one end of the eighteenth impedance 1310 is further connected to the receive end.

One end of the nineteenth impedance 1311 is connected to one end of the twentieth impedance 1312, another end of the nineteenth impedance 1311 is connected to the another end of the sixteenth impedance 119, and the one end of the nineteenth impedance 1311 is further connected to a receive end.

Another end of the twentieth impedance 1312 is connected to the one end of the fifteenth impedance 118, and the one end of the twentieth impedance 1312 is farther connected to the receive end.

A value of the seventeenth impedance 139 is the same as a value of the nineteenth impedance 1311, a value of the eighteenth impedance 1310 is the same as a value of the twentieth impedance 1312, the value of the seventeenth impedance 139 is far greater than the value of the fourteenth impedance 117, the value of the seventeenth impedance 139 is far greater than the value of the fifteenth impedance 118, the value of the seventeenth impedance 139 is far greater than the value of the sixteenth impedance 119, a value of the eighteenth impedance 1310 is far greater than the value of the fourteenth impedance 117, the value of the eighteenth impedance 1310 is far greater than the value of the fifteenth impedance 118, and the value of the eighteenth impedance 1310 is far greater than the value of the sixteenth impedance 119.

The high-pass filter 12 includes a transformer 121 and a DC blocking capacitor 122.

The transformer 121 includes two input pins and two output pins, where one output pin is connected to end of equivalent impedance 14 of a cable and a load, and the other output pin is connected to another end of the equivalent impedance 14 of the cable and load.

The DC blocking capacitor 122 is connected between two taps on a primary side of the transformer 121; or
one end of the DC blocking capacitor 122 is connected to the one output pin of the transformer 121, and another end of the DC blocking capacitor 122 is connected to the one end of the equivalent impedance 14 of the cable and load; or further, optionally, the DC blocking capacitor 122 includes a first DC blocking sub-capacitor and a second DC blocking sub-capacitor.

One end of the first DC blocking sub-capacitor is connected to one output pin of the transformer, and another end of the first DC blocking sub-capacitor is connected to the one end of the equivalent impedance of the cable and load.

One and of the second DC blocking sub-capacitor is connected to the other output pin of the transformer, and another end of the second DC blocking sub-capacitor is connected to the other end of the equivalent impedance of the cable and load.

Further, a possible implementation manner is that two taps on a secondary side of the transformer 121 are connected to each other; or
   another possible implementation manner is that two taps on a secondary side of the transformer 121 are connected to each other and are connected to a reference power supply; or
   a possible implementation manner is that: the high-pass filter 12 further includes a capacitor.

The capacitor is connected between two taps on a secondary side of the transformer 121.

The current output amplifier 10 is used, and output of the amplifier is a high impedance characteristic; when the current output amplifier 10 works normally, the output impedance of the current output amplifier 10 is high impedance when compared with that of the port impedance component, and when the current output amplifier 10 is switched off, the output of the current output amplifier 10 is also high impedance. Port impedance is mainly determined by the port impedance component and the high-pass filter that includes the transformer, and switch-on and switch-off of the current output amplifier 10 do not affect the port impedance; the port impedance component that mainly includes the fourteenth impedance 117 as a resistor network undergoes impedance transformation performed by the transformer 121 and then matches the equivalent impedance 14 of the cable and load; the fifteenth impedance 118 and the sixteenth impedance 119 are sampling resistors in a receiving direction; generally, to reduce power consumption, the value of the fourteenth impedance 117 is far greater than those of the fifteenth impedance 118 and the sixteenth impedance 119.

The echo cancellation module 13 includes the seventeenth impedance 139, the eighteenth impedance 1310, the nineteenth impedance 1311, and the twentieth impedance 1312 as an impedance network, where the seventeenth impedance 139, the eighteenth impedance 1310, the nineteenth impedance 1311, and the twentieth impedance 1312 separately sample voltages on two sides of the fifteenth impedance 118 and the sixteenth impedance 119 to complete sampling for a received signal and cancellation for a signal in a transmitting direction. Generally, impedance values of the seventeenth impedance 139 and the eighteenth impedance 1310 are far greater than those of the fourteenth impedance 117, the fifteenth impedance 118, and the sixteenth impedance 119.

Figure 7:
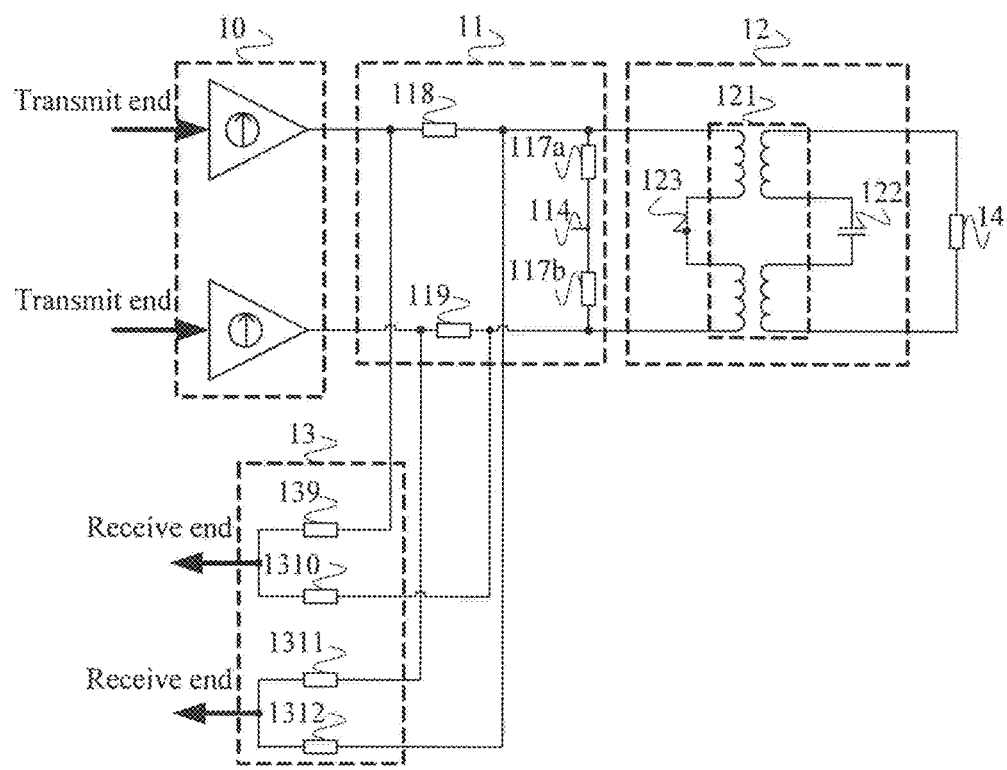
FIG. 7 is a schematic structural diagram of another copper wire interface circuit of Embodiment 4 according to the present invention.

Further, based on FIG. 6, FIG. 7 is a schematic structural diagram of another copper wire interface circuit of Embodiment 4 according to the present indention. It should be noted that except that the fourteenth impedance 117 is improved in the copper wire interface circuit shown in FIG. 7, other components are completely consistent with the components shown in FIG. 6 and details are not described again herein. As shown in FIG. 7, the fourteenth impedance 117 includes a seventh sub-impedance 117*a* and an eighth sub-impedance 117*b*.

The seventh sub-impedance 117*a* is connected in series to the eighth sub-impedance 117*b*, and a reference power supply is connected between the seventh sub-impedance 117*a* and the eighth sub-impedance 117*b*.

A value of the seventh sub-impedance 117*a* is the same as a value of the eighth sub-impedance 117*b*.

Persons of ordinary skill in the art should understand that all or a part of the steps in the method according to the embodiments of the present invention can be implemented by a program instructing relevant hardware, and the program may be stored in a computer readable storage medium. When the program is run, the steps of the method according to the embodiments of the present invention are performed. The storage medium includes a ROM/RAM, a magnetic disk, or an optical disk.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A copper wire interface circuit, comprising:
a current output amplifier;
a port impedance component;
a high-pass filter; and
an echo cancellation module;
wherein:
  one end of the current output amplifier is connected to the port impedance component, another end of the current output amplifier is connected to a transmit end, the current output amplifier is configured to amplify a to-be-transmitted signal, and output of the current output amplifier has an impedance characteristic;
  the port impedance component is further connected to the high-pass filter, and an impedance, after undergoing impedance transformation performed by the high-pass filter, of the port impedance component is used for performing impedance matching with equivalent impedance of a cable and a load;
  one end of the high-pass filter is connected to the port impedance component, another end of the high-pass filter is connected to the cable, and the high-pass filter is configured to filter the to-be-transmitted signal or a received signal and perform impedance transformation on the port impedance component;
  one end of the echo cancellation module is connected to the port impedance component, another end of the echo cancellation module is connected to a receive end, and the echo cancellation module is configured to perform sampling processing on the received signal and is further configured to perform cancellation processing on the to-be-transmitted signal;
  wherein the port impedance component comprises a first impedance, a second impedance, and a third impedance, wherein:
    one end of the first impedance is connected to one end of the second impedance, and another end of the first impedance is connected to one end of the third impedance,
    the one end of the second impedance is further connected to the current output amplifier, and another end of the second impedance is connected to one input pin of the high-pass filter,
    the one end of the third impedance is further connected to the current output amplifier, and another end of the third impedance is further connected to another input pin of the high-pass filter, and
    a value of the first impedance is greater than a value of the second impedance, the value of the first impedance is greater than a value of the third impedance, and the value of the second impedance is equal to the value of the third impedance; and
  the echo cancellation module comprises a fourth impedance, a fifth impedance, a sixth impedance, and a seventh impedance, wherein:
    one end of the fourth impedance is connected to one end of the fifth impedance, another end of the fourth impedance is connected to the one end of the second impedance, and the one end of the fourth impedance is further connected to a receive end, the one end of the fifth impedance is further connected to the receive end, and another end of the fifth impedance is connected to the another end of the third impedance, one end of the sixth impedance is connected to one end of the seventh impedance, another end of the sixth impedance is connected to the one end of the third impedance, and the one end of the sixth impedance is further connected to a receive end, the one end of the seventh impedance is further connected to the receive end, and another end of the seventh impedance is connected to the another end of the second impedance, and a value of the fourth impedance is the same as a value of the sixth impedance, a value of the fifth impedance is the same as a value of the seventh impedance, the value of the fourth impedance is greater than the value of the first impedance, the value of the fourth impedance is greater than the value of the second impedance, the value of the fourth impedance is greater than the value of the third impedance, a value of the fifth impedance is greater than the value of the first impedance, the value of the fifth impedance is greater than the value of the second impedance, and the value of the fifth impedance is greater than the value of the third impedance.

2. The copper wire interface circuit according to claim 1, wherein:

the first impedance comprises a first sub-impedance connected in series to a second sub-impedance;

a reference power supply is connected between the first sub-impedance and the second sub-impedance; and a value of the first sub-impedance is the same as a value of the second sub-impedance.

3. The copper wire interface circuit according to claim 1, wherein the high-pass filter comprises:

a transformer comprising two input pins and two output pins, wherein one output pin is connected to one end of the equivalent impedance of the cable and load, and the other output pin is connected to another end of the equivalent impedance of the cable and load; and a DC blocking capacitor connected between two taps on a primary side of the transformer; or one end of the DC blocking capacitor is connected to one output pin of the transformer, and another end of the DC blocking capacitor is connected to the one end of the equivalent impedance of the cable and load; or the DC blocking capacitor comprises a first DC blocking sub-capacitor and a second DC blocking sub-capacitor, wherein:

one end of the first DC blocking sub-capacitor is connected to the one output pin of the transformer, and another end of the first DC blocking sub-capacitor is connected to the one end of the equivalent impedance of the cable and load; and one end of the second DC blocking sub-capacitor is connected to the other output pin of the transformer, and another end of the second DC blocking sub-capacitor is connected to the another end of the equivalent impedance of the cable and load.

4. The copper wire interface circuit according to claim 3, wherein:

two taps on a secondary side of the transformer are connected to each other; or two taps on a secondary side of the transformer are connected to each other and are connected to a reference power supply; or the high-pass filter further comprises a capacitor, wherein the capacitor is connected between two taps on a secondary side of the transformer.

5. The copper wire interface circuit according to claim 3, wherein the ninth impedance is connected between the two central taps on the secondary side of the transformer.

6. A copper wire interface circuit, comprising:
a current output amplifier;
a port impedance component;
a high-pass filter; and
an echo cancellation module;
wherein:

one end of the current output amplifier is connected to the port impedance component, another end of the current output amplifier is connected to a transmit end, the current output amplifier is configured to amplify a to-be-transmitted signal, and output of the current output amplifier has an impedance characteristic;

the port impedance component is further connected to the high-pass filter, and an impedance, after undergoing impedance transformation performed by the high-pass filter, of the port impedance component is used for performing impedance matching with equivalent impedance of a cable and a load;

one end of the high-pass filter is connected to the port impedance component, another end of the high-pass filter is connected to the cable, and the high-pass filter is configured to filter the to-be-transmitted signal or a received signal and perform impedance transformation on the port impedance component;

one end of the echo cancellation module is connected to the port impedance component, another end of the echo cancellation module is connected to a receive end, and the echo cancellation module is configured to perform sampling processing on the received signal and is further configured to perform cancellation processing on the to-be-transmitted signal;

wherein:

the port impedance component comprises an eighth impedance and a ninth impedance, wherein:

one end of the eighth impedance is connected to the current output amplifier, the one end of the eighth impedance is further connected to one input pin of the high-pass filter, another end of the eighth impedance is connected to the current output amplifier, and the one end of the eighth impedance is further connected to another input pin of the high-pass filter, the ninth impedance is connected between two central taps on a secondary side of a transformer in the high-pass filter, and a value of the eighth impedance is greater than a value of the ninth impedance; and the echo cancellation module comprises a tenth impedance, an eleventh impedance, a twelfth impedance, and a thirteenth impedance, wherein:

one end of the tenth impedance is connected to one end of the eleventh impedance, another end of the tenth impedance is connected to the one input pin of the high-pass filter, and the one end of the tenth impedance is further connected to a receive end, the one end of the eleventh impedance is further connected to the receive end, and another end of the eleventh impedance is connected to one end of the ninth impedance, one end of the twelfth impedance is connected to one end of the thirteenth impedance, another end of the twelfth impedance is connected to the another input pin of the high-pass filter, and the one end of the twelfth impedance is further connected to a receive end, the one end of the thirteenth impedance is further connected to the receive end, and another end of the thirteen impedance is connected to another end of the ninth impedance, and a value of the tenth impedance is the same as a value of the twelfth impedance, a value of the eleventh impedance is the same as a value of the thirteenth impedance, the value of the tenth impedance is greater than the value of the eighth impedance, the value of the tenth impedance is greater than the value of the ninth impedance, a value of the eleventh impedance is greater than the value of the eighth impedance, and the value of the eleventh impedance is greater than the value of the ninth impedance.

7. The copper wire interface circuit according to claim 6, wherein:

the eighth impedance comprises a third sub-impedance connected in series to a fourth sub-impedance;

a reference power supply is connected between the third sub-impedance and the fourth sub-impedance; and a value of the third sub-impedance is the same as a value of the fourth sub-impedance.

8. The copper wire interface circuit according to claim 6, wherein:

the ninth impedance comprises a fifth sub-impedance connected in series to a sixth sub-impedance;

a reference power supply is connected between the fifth sub-impedance and the sixth sub-impedance; and a value of the fifth sub-impedance is the same as a value of the sixth sub-impedance.

9. The copper wire interface circuit according to claim 6, wherein the ninth impedance is connected between the two central taps on the secondary side of the transformer.

10. A copper wire interface circuit, comprising:

a current output amplifier;

a port impedance component;

a high-pass filter; and an echo cancellation module;

wherein:

one end of the current output amplifier is connected to the port impedance component, another end of the current output amplifier is connected to a transmit end, the current output amplifier is configured to amplify a to-be-transmitted signal, and output of the current output amplifier has an impedance characteristic;

the port impedance component is further connected to the high-pass filter, and an impedance, after undergoing impedance transformation performed by the high-pass filter, of the port impedance component is used for performing impedance matching with equivalent impedance of a cable and a load;

one end of the high-pass filter is connected to the port impedance component, another end of the high-pass filter is connected to the cable, and the high-pass filter is configured to filter the to-be-transmitted signal or a received signal and perform impedance transformation on the port impedance component;

one end of the echo cancellation module is connected to the port impedance component, another end of the echo cancellation module is connected to a receive end, and the echo cancellation module is configured to perform sampling processing on the received signal and is further configured to perform cancellation processing on the to-be-transmitted signal;

wherein:

the port impedance component comprises a fourteenth impedance, a fifteenth impedance, and a sixteenth impedance, wherein:

one end of the fourteenth impedance is connected to one input pin of the high-pass filter, the one end of the fourteenth impedance is further connected to one end of the fifteenth impedance, another end of the fourteenth impedance is connected to another input pin of the high-pass filter, and the another end of the fourteenth impedance is further connected to one end of the sixteenth impedance, another end of the fifteenth impedance is connected to the current output amplifier, another end of the sixteenth impedance is connected to the current output amplifier, and a value of the fourteenth impedance is greater than a value of the fifteenth impedance, the value of the fourteenth impedance is greater than a value of the sixteenth impedance, and the value of the fifteenth impedance is equal to the value of the sixteenth impedance; and the echo cancellation module comprises a seventeenth impedance, an eighteenth impedance, a nineteenth impedance, and a twentieth impedance, wherein:

one end of the seventeenth impedance is connected to one end of the eighteenth impedance, another end of the seventeenth impedance is connected to the another end of the fifteenth impedance, and the one end of the seventeenth impedance is further connected to a receive end, another end of the eighteenth impedance is connected to the one end of the sixteenth impedance, and the one end of the eighteenth impedance is further connected to the receive end, one end of the nineteenth impedance is connected to one end of the twentieth impedance, another end of the nineteenth impedance is connected to the another end of the sixteenth impedance, and the one end of the nineteenth impedance is further connected to the receive end, another end of the twentieth impedance is connected to the one end of the fifteenth impedance, and the one end of the twentieth impedance is further connected to the receive end, and a value of the seventeenth impedance is the same as a value of the nineteenth impedance, a value of the eighteenth impedance is the same as a value of the twentieth impedance, the value of the seventeenth impedance is greater than the value of the fourteenth impedance, the value of the seventeenth impedance is greater than the value of the fifteenth impedance, the value of the seventeenth impedance is greater than the value of the sixteenth impedance, a value of the eighteenth impedance is greater than the value of the fourteenth impedance, the value of the eighteenth impedance is greater than the value of the fifteenth impedance, and the value of the eighteenth impedance is greater than the value of the sixteenth impedance.

11. The copper wire interface circuit according to claim 10, wherein:
the fourteenth impedance comprises a seventh sub-impedance connected in series to an eighth sub-impedance;
a reference power supply is connected between the seventh sub-impedance and the eighth sub-impedance; and
a value of the seventh sub-impedance is the same as a value of the eighth sub-impedance.

\* \* \* \* \*